United States Patent
Vasquez et al.

(10) Patent No.: US 10,446,744 B2
(45) Date of Patent: Oct. 15, 2019

(54) MAGNETIC TUNNEL JUNCTION WAFER ADAPTOR USED IN MAGNETIC ANNEALING FURNACE AND METHOD OF USING THE SAME

(71) Applicant: Spin Transfer Technologies, Inc., Fremont, CA (US)

(72) Inventors: Jorge Vasquez, Fremont, CA (US); Danny Yam, Fremont, CA (US)

(73) Assignee: Spin Memory, Inc., Fremont, CA (US)

(*) Notice: Subject to any disclaimer, the term of this patent is extended or adjusted under 35 U.S.C. 154(b) by 0 days.

(21) Appl. No.: 15/916,078

(22) Filed: Mar. 8, 2018

(65) Prior Publication Data

US 2019/0280194 A1 Sep. 12, 2019

(51) Int. Cl.
H01L 43/12 (2006.01)
H01L 43/08 (2006.01)

(52) U.S. Cl.
CPC ............ *H01L 43/12* (2013.01); *H01L 43/08* (2013.01)

(58) Field of Classification Search
CPC ............................. H01L 43/12; H01L 43/08
See application file for complete search history.

(56) References Cited

U.S. PATENT DOCUMENTS

| | | |
|---|---|---|
| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |

(Continued)

FOREIGN PATENT DOCUMENTS

| | | |
|---|---|---|
| CA | 2766141 | 1/2011 |
| CN | 105706259 | 6/2016 |

(Continued)

OTHER PUBLICATIONS

US 7,026,672 B2, 04/2006, Grandis (withdrawn)

(Continued)

*Primary Examiner* — Karen Kusumakar

(57) ABSTRACT

Semiconductor substrate adaptor configured to adapt a substrate of a first dimension to a second dimension, such that the substrate can be properly supported by a supporting mechanism (e.g., a wafer cassette) customized for substrates of the second dimension. The substrate adaptor may be made of quartz. The combination of the substrate adaptor and a substrate fitting therein causes no perturbation in various aspects of a semiconductor process. Therefore, the substrate adaptor conveniently enables a substrate of the first dimension to be processed in the same processing equipment and conditions as a substrate of the second dimension. A vertical substrate adaptor may have a semicircular body with a semicircular cutout for accommodating a wafer and can support a wafer vertically. A horizontal substrate adaptor may have a circular body with a circular cutout for accommodating an entire wafer and supporting the wafer horizontally.

22 Claims, 7 Drawing Sheets

(56) References Cited

U.S. PATENT DOCUMENTS

| | | |
|---|---|---|
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | You et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,363 B1 | 11/2005 | Huai |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimora |
| 7,573,737 B2 | 8/2009 | Kent et al. |
| 7,576,956 B2 | 8/2009 | Huai |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |
| 7,810,017 B2 | 10/2010 | Radke |
| 7,821,818 B2 | 10/2010 | Dieny et al. |

(56) References Cited

U.S. PATENT DOCUMENTS

| | | |
|---|---|---|
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Zhong et al. |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,255,742 B2 | 8/2012 | Ipek |
| 8,278,996 B2 | 10/2012 | Miki |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozaki |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong et al. |
| 8,477,530 B2 | 7/2013 | Ranjan et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,722,543 B2 | 5/2014 | Belen |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,867,258 B2 | 10/2014 | Rao |
| 8,883,520 B2 | 11/2014 | Satoh et al. |
| 8,902,628 B2 | 12/2014 | Ha |
| 8,966,345 B2 | 2/2015 | Wilkerson |
| 8,987,849 B2 | 3/2015 | Jan |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,812 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |
| 9,136,463 B2 | 9/2015 | Li |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |
| 9,196,332 B2 | 11/2015 | Zhang et al. |
| 9,229,806 B2 | 1/2016 | Mekhanik et al. |
| 9,229,853 B2 | 1/2016 | Khan |
| 9,231,191 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naeimi |
| 9,317,429 B2 | 4/2016 | Ramanujan |
| 9,324,457 B2 | 4/2016 | Takizawa |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |

(56) References Cited

U.S. PATENT DOCUMENTS

| | | | |
|---|---|---|---|
| 9,520,192 B2 | 12/2016 | Naeimi et al. |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tomishima et al. |
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2002/0170673 A1* | 11/2002 | Tanguay | C23C 14/56 156/345.32 |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0197174 A1* | 10/2004 | Van Den Berg | H01L 21/67781 414/404 |
| 2004/0257717 A1 | 12/2004 | Sharma et al. |
| 2005/0022746 A1* | 2/2005 | Lampe | C23C 16/4581 118/728 |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0155158 A1 | 6/2012 | Higo |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0263569 A1* | 10/2012 | Priddy | C30B 23/02 414/800 |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0279904 A1 | 10/2015 | Pinarbasi et al. |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2018/0030617 A1* | 2/2018 | Kang | C23C 14/0617 |
| 2018/0033957 A1 | 2/2018 | Zhang |
| 2018/0097006 A1 | 4/2018 | Kim et al. |

(56) References Cited

U.S. PATENT DOCUMENTS

| | | |
|---|---|---|
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1* | 7/2018 | Kogler ................ C23C 16/4583 |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, Vol, 84, No, 23, Jun. 5, 2000, pp, 5419-5422 (4 pages).

K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

MAGNETIC TUNNEL JUNCTION WAFER ADAPTOR USED IN MAGNETIC ANNEALING FURNACE AND METHOD OF USING THE SAME

FIELD OF THE INVENTION

Embodiments of the present application relate to semiconductor processing and equipment, and more particularly, to devices for holding semiconductor substrates for processing.

BACKGROUND OF THE INVENTION

Magnetoresistive random-access memory (MRAM) is a non-volatile random-access memory technology that has been recognized to potentially meet the demands for continued increases in density of existing memory technologies, notably flash RAM and DRAM. A Magnetic Tunnel Junction (MTJ)-based MRAM device includes arrays of MTJ-based memory cells which can store data in the magnetization orientation between ferromagnetic layers of the MTJ in each cell.

More specifically, an MTJ includes three essential layers: a free layer, a tunneling barrier layer, and a pinned layer. The free layer and the pinned layer are ferromagnetic layers, the tunneling barrier layer is a thin insulator layer located in-between. In the free layer, the magnetization direction is free to rotate; whereas, the magnetization of the pinned layer is fixed and therefore this layer is also referred as the "fixed layer." An anti-ferromagnetic layer may be used to fix, or pin, the magnetization of the pinned layer in a particular direction. A data bit is written to the MTJ by changing the magnetization direction of one of the ferromagnetic plates of the magnetic element. The orientations of the magnetic moments of the free layer and the pinned layer determine the resistance of the MTJ which dictates the bit value of the memory cell, "0" or "1."

Spin torque transfer (STT) is a technique for writing to MTJ-based memory cells. When a spin-polarized current (most of the electrons of the current have spins aligned in the same direction) is applied to a free ferromagnetic layer, the electrons may get repolarized on account of the orientation of the magnetic moments of the free layer. The free layer experiences a torque associated with the change in the angular momentum of the electrons as they are repolarized. If the current density is high enough, this torque has enough energy to switch the magnetization direction of the free layer. As a result, the bit data represented by the memory cell can switch between "1" and "0." The advantages of using STT for writing to magnetic elements have been well established, including smaller bit size, fewer process steps, better scalability for large arrays, and lower writing current requirements, as compared with other writing techniques.

Depending on the orientation of the magnetic anisotropy of the fixed layers, there are two main types of MTJs used in MRAM, perpendicular MTJs and in-plane MTJs. In a perpendicular MTJ, the magnetic anisotropy of the fixed layer is generally perpendicular to the planes of fixed layer and the substrate surface; whereas in an in-plane MTJ, the magnetic anisotropy of the fixed layer is generally parallel to the planes of fixed layer and the substrate surface.

Fabrication of MTJ-based memory cells involves complex processing procedures, including formation of a stack of multiple layers of various films and several annealing steps. Particularly, after a fixed layer is deposited on a Silicon substrate and etched into pillars for individual MTJ cells, the substrate undergoes a magnetic annealing process to magnetize the fixed layer pillars. For example, the magnetic annealing process is executed in a furnace (or an annealing chamber) under vacuum at an elevated temperature by using a predetermined external magnetic field.

During such a magnetic annealing process, it is critical that the features on the substrate are uniformly and consistently subject to the temperature and magnetic field as defined in a processing recipe. Practically, limited by the overall size of the annealing equipment, the magnetic field and the temperature distribution in the annealing chamber can only be optimized for a relatively small center region yet sufficient to encompass the processing zone. A cassette holding the substrates has to be placed precisely within the small region to ensure processing uniformity and repeatability. Moreover, to maintain the steady-state temperature precisely at the intended level and ensure the temperature ramping profiles to be consistent in each magnetic annealing process, a proportional-integral-derivative (PID) controller of the heating system is calibrated based on the thermal load of a particular size of substrates, e.g., 300 mm Si wafers. If any deviation from the anticipated thermal load is sensed in the annealing chamber, the PID controller tends to cause temperature instability which could lead to manufacturing failure. Thus, conventionally, unless the PID controller is recalibrated, the annealing equipment is restricted to processing a particular pre-calibrated size of substrates because loading a different size of substrates and a matching cassette would introduce a substantial thermal load change for which the heater is not calibrated to process. Unfortunately, a recalibration procedure of a PID controller is usually time-consuming, error-prone and can contribute to significant production cost.

SUMMARY OF THE INVENTION

Disclosed herein are mechanisms that provide a substrate adaptor for adapting a substrate of a first dimension to a second dimension so that the substrate can be loaded and processed in a processing chamber that has been configured and optimized for processing substrates of the second or a different dimension.

Embodiments of the present disclosure provide a substrate adaptor having a planar body that substantially mimics a 300 mm wafer and a cutout that can accommodate a wafer of a smaller size, for example 50 mm, 100 mm, 150 mm or 200 mm. The substrate adaptor is made of a material that has the same thermal mass as Si wafers and can fit in a cassette or another substrate supporting mechanism designed for 300 mm wafers. For example, when used in a magnetic annealing chamber that has been optimized for 300 mm wafers, the substrate adaptor with a smaller wafer fitting in the cutout advantageously causes no perturbation to the magnetic field and the temperature distribution or ramping profile in the chamber when processing a smaller wafer. In compliance with the semiconductor wafer standards, the substrate holder may have an alignment notch and the cutout may have one or more alignment flats. In one preferred embodiment, the substrate adaptor is made of quartz which is typically non-reactive and is also the same material as a cassette typically used in an annealing chamber.

In the following discussion, 300 mm wafers are discussed as the control wafer size for the calibration of the thermal heater system. However, this convention is merely exemplary and any control wafer diameter can be used equally well with the embodiments of the present disclosure. The adaptor, either vertical or horizontal, can be used with any sized control wafer diameter.

In one embodiment, the substrate adaptor is configured to support a smaller-than-300 mm wafer in a vertical position for processing, herein also referred as "vertical substrate adaptor." In one exemplary application, in-plane MTJ devices are fabricated on the wafer and the adaptor is used in a magnetic annealing process to magnetize the fixed layer pillars on the wafer with the wafer oriented in parallel with an external magnetic field. The vertical substrate adaptor is semicircular with a diameter of 300 mm, and one or more semicircular cutouts are formed on the diameter edge side. Each cutout has substantially the same dimension as the smaller-than-300 mm wafer and has a slot running through the semicircle perimeter. For instance, the slot on the cutout is approximately 3 mm in depth. With this configuration, the edge of half of the wafer can be inserted into the slot and thereby supported and oriented vertically in the same plane as the substrate adaptor, e.g., while the substrate adaptor is positioned vertically in a cassette designed for 300 mm wafers.

In another embodiment, the substrate adaptor is configured to support a smaller-than-300 mm wafer in a horizontal position for processing, herein also referred as a horizontal substrate adaptor. In one exemplary application, perpendicular MTJ devices are fabricated on the wafer and the vertical substrate adaptor is used in a magnetic annealing to magnetize the fixed layer pillars on the wafer with the wafer oriented perpendicular to an external magnetic field. The substrate adaptor has a 300 mm planar body that is substantially circular and has the substantially same perimeter contour as a 300 mm wafer. Thus, the substrate adaptor can fit in a cassette designed for 300 mm wafers. One or more circular cutouts are formed on the circular body, and each cutout has a step running through the entire perimeter. The step has a width of about 3 mm for instance. With this configuration, the smaller wafer can entirely fit in the cutout and supported by the step, e.g., while the substrate adaptor is positioned horizontally in a 300 mm wafer cassette. When the wafer is coupled to the substrate adaptor, their upper surfaces are approximately in the same plane.

According to embodiments of the present disclosure, a substrate holder can be used to adapt a wafer of one size to fit in a cassette designed for wafers of a different size. The combination of the substrate holder with the smaller wafer mimics the size and density of the larger wafer. Thus, processing equipment optimized for a particular size of wafers (e.g., 300 mm wafers) can flexibly process a smaller size of wafers (e.g., 50 mm or 150 mm) without requiring hardware reconfigurations or processing recipe modifications, advantageously eliminating the time and expense associated with making such changes.

BRIEF DESCRIPTION OF THE DRAWINGS

Embodiments of the present invention will be better understood from a reading of the following detailed description, taken in conjunction with the accompanying figures, in which like reference characters designate like elements.

DETAILED DESCRIPTION

Figure 1:
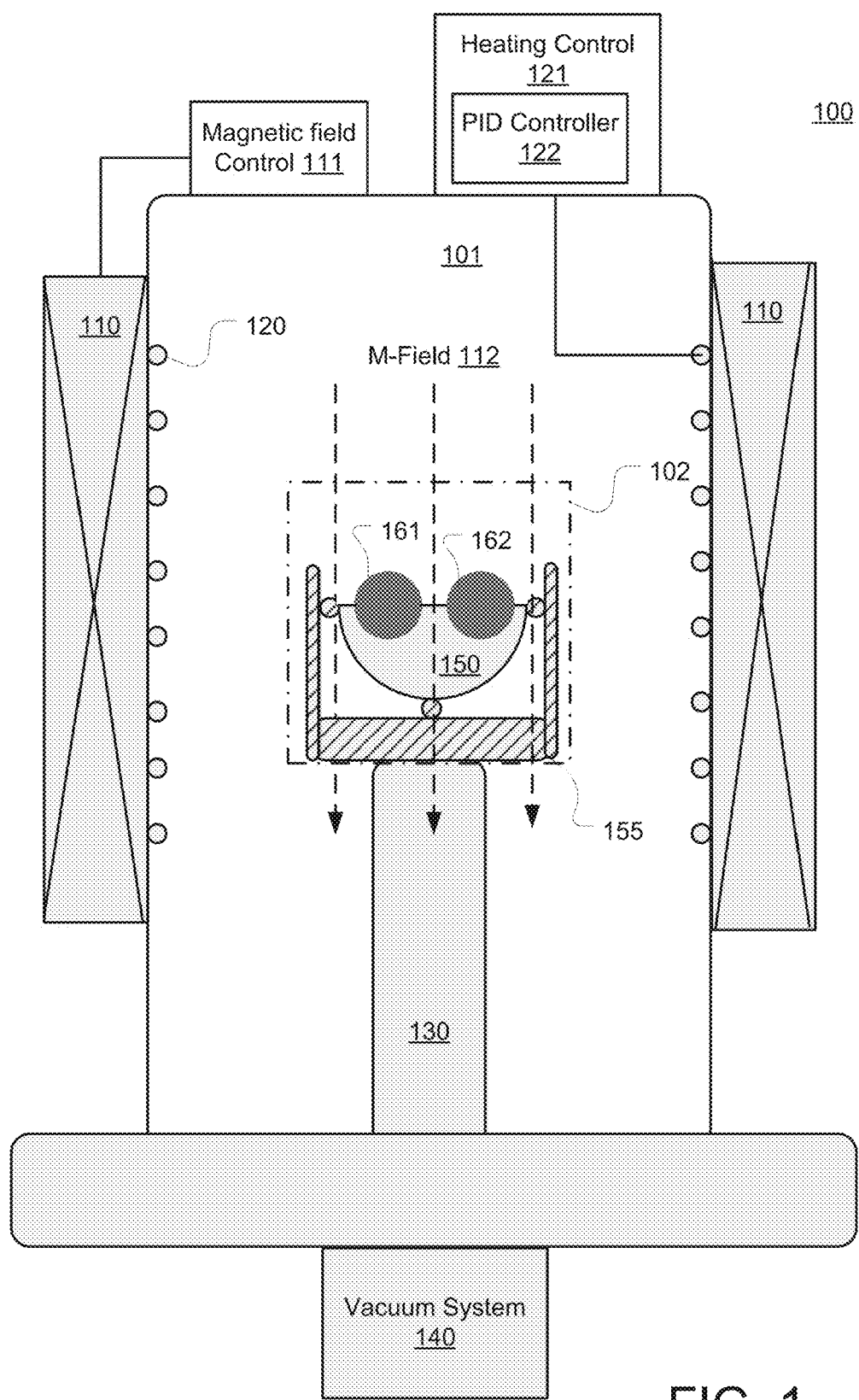
FIG. 1 illustrates the configuration of a magnetic anneal furnace that can process 100 mm wafers as well as 300 mm wafers in a vertical orientation for in-plane magnetization by using an exemplary substrate adaptor in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

MAGNETIC TUNNEL JUNCTION WAFER ADAPTOR USED IN MAGNETIC ANNEALING FURNACE AND METHOD OF USING THE SAME

Overall, embodiments of the present disclosure provide a semiconductor substrate adaptor configured to adapt a substrate of a first dimension to a second dimension, such that the substrate can be properly supported by a supporting mechanism that is customized for substrates of the second dimension. The substrate adaptor is made of a material that has similar thermal, electrical and magnetic properties with the substrate material. Thus, the combination of the substrate adaptor and a substrate accommodated therein mimics the size and density of a wafer of the second dimension and therefore would cause no remarkable perturbation to various aspects of a semiconductor process, such as chemistry, electrical field distribution, temperature distribution and ramping profiles, magnetic field distribution in the processing zone that has been calibrated for second dimension wafers. Therefore, the substrate adaptor conveniently enables a substrate of the first dimension to be processed in the same processing equipment and conditions as a substrate of the second dimension.

Although embodiments herein are described in detail with reference to substrates and equipment used for Magnetic Tunnel Junction (MTJ)-based memory fabrication, the present disclosure is not limited to such application. A substrate holder in accordance with an embodiment of the present disclosure can be used to adapt and support a wafer in any suitable processing chamber and for any suitable fabrication process, such as etching, deposition, annealing, lithography, implantation and etc.

Herein, embodiments of the present disclosure are described in detail by using Si wafers compliant with semiconductor standards as substrates. However, it will be appreciated that a substrate adaptor according to embodiments of the disclosure can be made for any other suitable type of substrate for semiconductor fabrication. Further, the present disclosure is not limited to any specific dimension of a substrate holder, or the dimension of a wafer that can fit in the substrate holder and is not limited to any control wafer size, e.g., 300 mm.

FIG. 1 illustrates the configuration of a magnetic annealing furnace 100 that can process 100 mm wafers 161 and 162 as well as 300 mm wafers aligned in a vertical orientation for in-plane magnetization by using an exemplary substrate adaptor 150 in accordance with an embodiment of the present disclosure. For example, the wafers 161 and 162 are fabricated for producing MTJ-based MRAM cells. Before loading to the magnetic annealing furnace 100, the wafers 161 and 162 has been processed and deposited with a fixed magnetization layer which has been etched into pillars.

During the magnetic annealing process, the annealing chamber 101 is maintained under vacuum and heated to a preset temperature, and an external magnetic field 112 in the axial direction of the chamber 101 is applied to the wafers. The furnace 100 includes electromagnetic coils 110 and a control module 111 for controlling the generation of the magnetic field 112. Heating elements 120 are disposed inside or around the annealing chamber 101 and coupled to thermocouples (not shown) and a heating control module 121. A vacuum system 140 operates to achieve a vacuum in the chamber 101. The heating control module 121 uses a proportional-integral-derivative (PID) controller 122 to maintain the chamber temperature at a preset level and control the temperature ramping profiles.

The annealing chamber 101 and various components therein may have been configured and optimized for in-plane magnetization of 300 mm wafers. As noted above, due to spatial non-uniformity of the magnetic field and temperature distribution across the processing chamber, it is only practical to achieve a uniform magnetic field and a uniform temperature in a relatively small processing zone (shown by the box 102) where the wafer cassette is positioned for processing as shown. The substrate pedestal 130 has a coupling mechanism configured to load and support a 300 mm wafer cassette to the optimized processing zone 102. The PID controller 122 has been calibrated based on a thermal load of a cassette of 300 mm wafers. If any deviation from this anticipated thermal load is sensed in the annealing chamber 101, the PID controller 122 tends to cause undesirable temperature instability. It will be appreciated that a same number of wafers of a different size, e.g., 50 or 200 mm, constitutes a substantially different thermal load than a cassette of 300 mm wafers.

According to an embodiment of the present disclosure, wafers smaller than 300 mm are coupled to a vertical substrate adaptor 150 that mimics a portion of a 300 mm wafer. The substrate adaptor 150 has two semicircular cutouts configured to accommodate two 100 mm wafers 161 and 162. The configuration of the vertical substrate adaptor is described in greater detail below with reference to FIGS. 3, 4A and 4B. As illustrated, two 100 mm wafers 161 and 162 are supported vertically by the substrate adaptor 150 in a 300 mm wafer cassette 155 and positioned in the same plane as the substrate adaptor 150. Because the smaller wafers 161 and 162 can still be properly contained a 300 mm cassette, they can be placed in the optimized processing zone 102 when the pedestal 130 is elevated to the same height as defined for processing 300 mm wafers.

Further, because the vertical substrate adaptor 150 is made of a material that has a similar thermal mass with the substrate material, the thermal load difference between a 300 mm wafer and the smaller wafers 161 and 162 combined the substrate holder is insignificant from the perspective of the PID controller 122. This advantageously eliminates the need for recalibrating the PID controller 122 when switching from processing 300 mm wafers to processing 100 mm wafers thereby advantageously saving calibration time and expense. A substrate adaptor can be made of any suitable material or composition of materials without departing from the scope of the present disclosure. Preferably, the substrate holder 150 is made of material that is chemically inert, electrically insulating, and non-magnetic. In some embodiments, the substrate adaptor 150 is made of quartz. Such a substrate adaptor advantageously does not interfere with any processing conditions as it does not alter the electrical field, magnetic field or chemistry environment (if any) in processing equipment.

Figure 2:
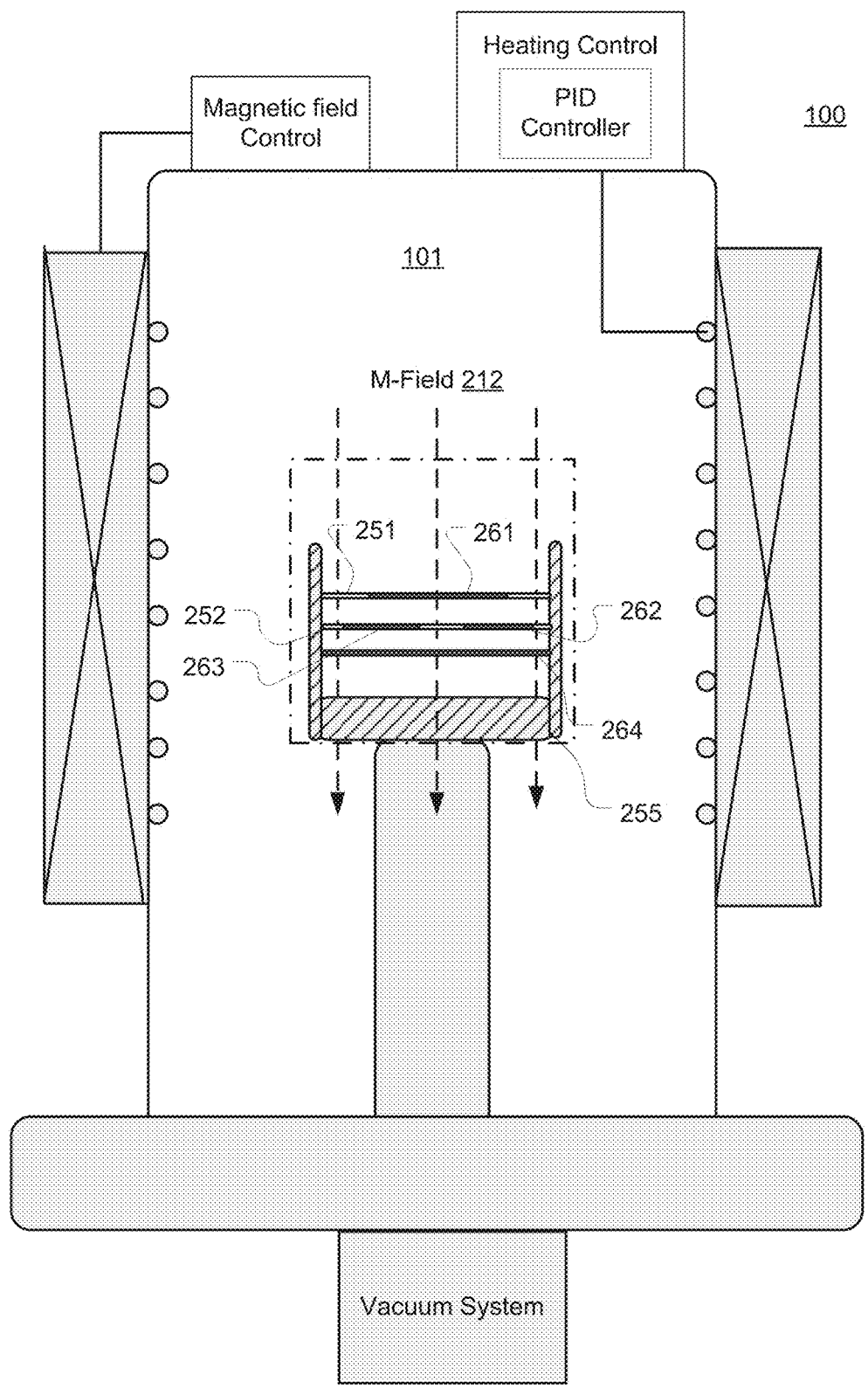
FIG. 2 illustrates the configuration of the magnetic annealing furnace that can process wafers smaller than 300 mm as well as 300 mm wafers in a horizontal orientation for perpendicular magnetization by using exemplary substrate adaptors in accordance with embodiments of the present disclosure.

The same magnetic annealing furnace 100 can also be used to process wafers in a horizontal orientation for perpendicular magnetization, where the wafers are positioned horizontally and perpendicular to the axial magnetic field. FIG. 2 illustrates the configuration of the magnetic annealing furnace 100 that can process wafers smaller than 300 mm as well as 300 mm wafers in a horizontal orientation for perpendicular magnetization by using exemplary substrate adaptors 251 and 252 in accordance with embodiments of the present disclosure. The cassette 255 is customized for supporting 300 mm wafers horizontally, e.g., the 300 mm wafer 264. Besides, the cassette can also support wafers smaller 300 mm 261, 262 and 263 by using horizontal substrate adaptors 251 and 252.

Similar with the example shown in FIG. 1, before loading into the annealing equipment 100, the wafers 261, 262, 263 and 264 have been deposited with a fixed magnetization layer which has been etched into pillars. During the magnetic annealing process, the annealing chamber 101 is maintained under vacuum and heated to a preset temperature, an external magnetic field 212 in the axial direction of the processing chamber is applied to the wafers. The annealing chamber 101 and various components therein may have been configured and optimized for perpendicular magnetization of 300 mm wafers.

According to an embodiment of the present disclosure, a wafer smaller than 300 mm can be coupled to a horizontal substrate adaptor which has a perimeter that mimics the perimeter of a 300 mm wafer and therefore can be loaded in the 300 mm cassette for processing in a horizontal orientation. More specifically, the horizontal substrate adaptor 251 has a single circular cutout (with supporting lip) configured to accommodate the entire 200 mm wafer 261 horizontally. The horizontal substrate adaptor 252 has two circular cutout configured to entirely accommodate the 100 mm wafers 262 and 263. The configurations of the horizontal substrate adaptors are described in greater detail below with reference to FIGS. 5, 6A and 6B.

Figure 3:
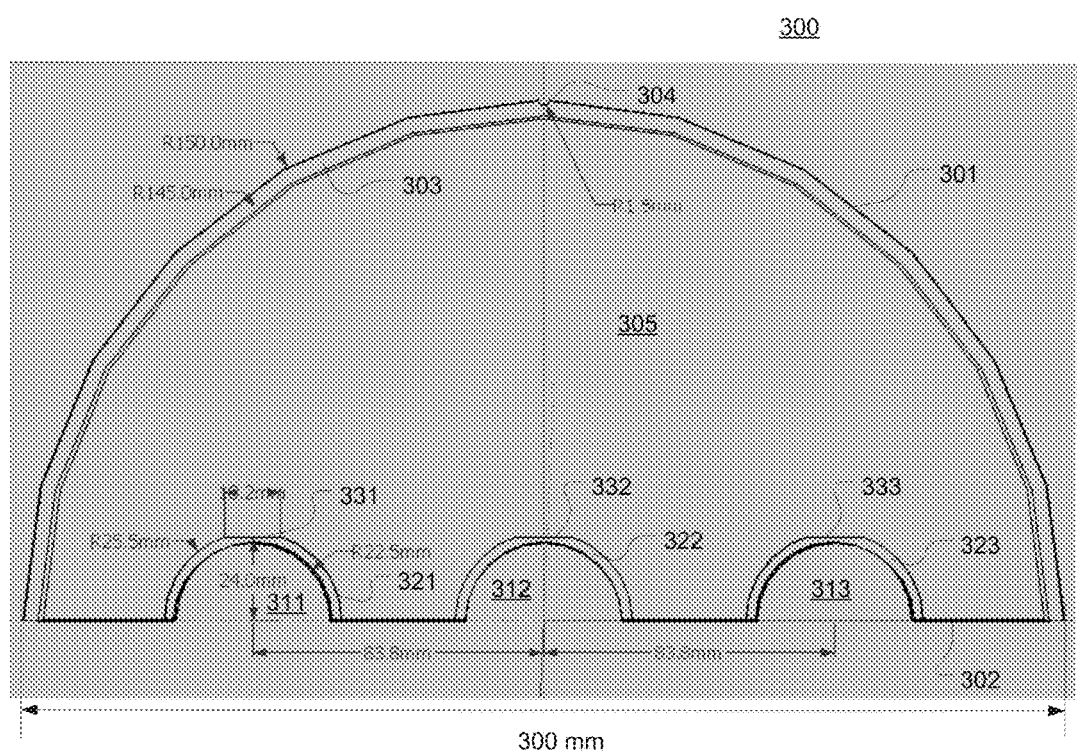
FIG. 3 illustrates the configuration of an exemplary vertical substrate adaptor that can support three 50 mm wafers vertically in accordance with an embodiment of the present disclosure.

FIG. 3 illustrates the configuration of an exemplary vertical substrate adaptor 300 in more detail that can support three 50 mm wafers vertically in accordance with an embodiment of the present disclosure. The substrate adaptor 300 is based on a planar body 305 that is substantially semicircular with a 300 mm diameter. The semicircular body is defined by the curved edge 301 and the diameter edge 302 which is incomplete due to cutouts. Three 50 mm substantially semicircle cutouts 311, 312 and 313 are formed on the diameter edge side of the semicircle body and configured to accommodate 50 mm wafers. In this example, the cutouts 311-313 are coaxial with semicircle body 305. The centers of two adjacent cutouts are spaced apart by 83.8 mm for instance.

A trench or slot 322, 323 or 324 is formed around the semicircle perimeter of each cutout so that a wafer can be inserted therein. In this configuration, as the vertical substrate adaptor 300 is placed vertically with the cutouts on the top and the trenches open to the top (e.g., as sitting in a slot of a 300 mm wafer cassette), the edge the half of a 50 mm wafer is inserted into the trench and thus the wafer can be held in a vertical orientation as well (e.g., see the wafers fitting in the vertical substrate adaptor 150 in FIG. 1). In the illustrated example, the trench is about 3 mm deep. The middle portion of the semicircle body (e.g., up to radius=145 mm) may be thicker than a 50 mm wafer. However, a 5 mm band 303 around the curved edge 301 is made to have substantially the same thickness as the edge of a 300 mm wafer so that the curved edge 301 can fit in a slot of a standard 300 mm wafer cassette. Further, the vertical substrate holder 300 has an alignment notch 304 with radius of 1.5 mm, similar with a standard 300 mm wafer. By the same token, the cutouts 311-313 have alignment flats 331-333 for standard 50 mm wafers to fit in.

The weight of the substrate adaptor 300 is selected such that it, in combination with three smaller wafers inserted into slots 311-313 will mimic the weight of a single wafer with a 300 mm diameter. This weight of the substrate adaptor 300 can be realized by adjusting the thickness of the wafer.

In some other embodiments, rather than based on a semicircular body as shown in FIG. 3, a vertical substrate adaptor can be based on a less-than-semicircle or a minor segment of a circle. In still some other embodiments, a vertical substrate adaptor can be based on a more-than-semicircle or a major segment of a circle. A cutout in a vertical substrate adaptor may also be a minor segment of a circle rather than a semicircle.

Figure 4A:
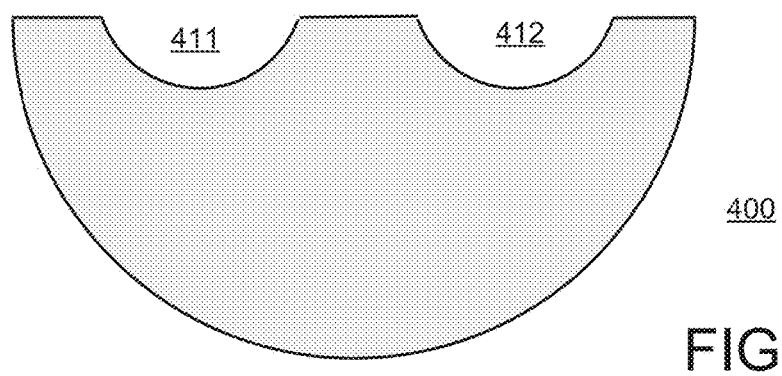
FIGS. 4A-4B illustrate exemplary cutout layouts in vertical substrate adaptors in accordance with embodiments of the present disclosure.
Figure 4B:
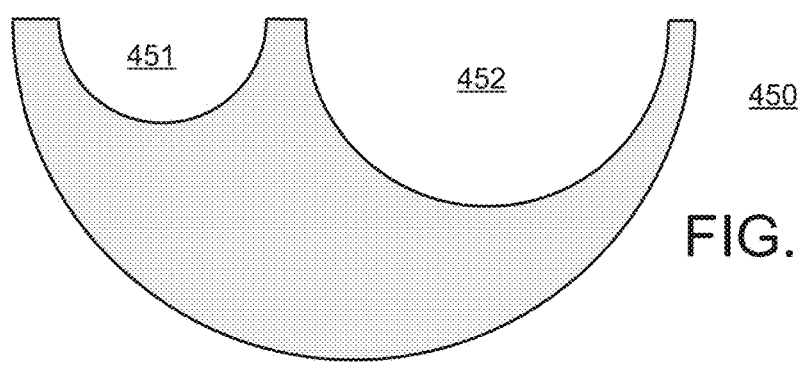

The present disclosure is not limited to any specific layout, position or geometry of a cutout for accommodating a wafer in a substrate adaptor, nor limited to any specific number of cutouts in a substrate adaptor. A cutout can be disposed in any suitable location of the substrate adaptor. For example, a cutout may be coaxial or non-coaxial with the planar body of the substrate adaptor. FIGS. 4A-4B illustrates exemplary cutout layouts 411 and 412 in vertical substrate adaptors 400 and 450 in accordance with embodiments of the present disclosure. FIG. 4A shows that the vertical substrate adaptor 400 has two cutouts configured to accommodate two wafers of the same dimension, e.g., 100 mm wafers. The cutouts 411 and 412 are each a minor segment of a 100 mm circle. FIG. 4B shows that the vertical substrate adaptor 450 has two cutouts configured to accommodate two wafers of different dimensions e.g., 50 mm and 100 mm wafers respectively. The cutouts 451 and 452 are each a semicircle. It will be appreciated that the substrate adaptors 400 and 450 have other features such as trenches, edge bands, flats and notches similar with those described in FIG. 3 which are not explicitly shown here. As described above, the overall weight of any of the adaptors 400 or 450 equals the weight of a 300 mm wafer minus the weight of the expected wafers placed therein t the slots, e.g., 411 and 412 or 451 and 452.

Figure 5:
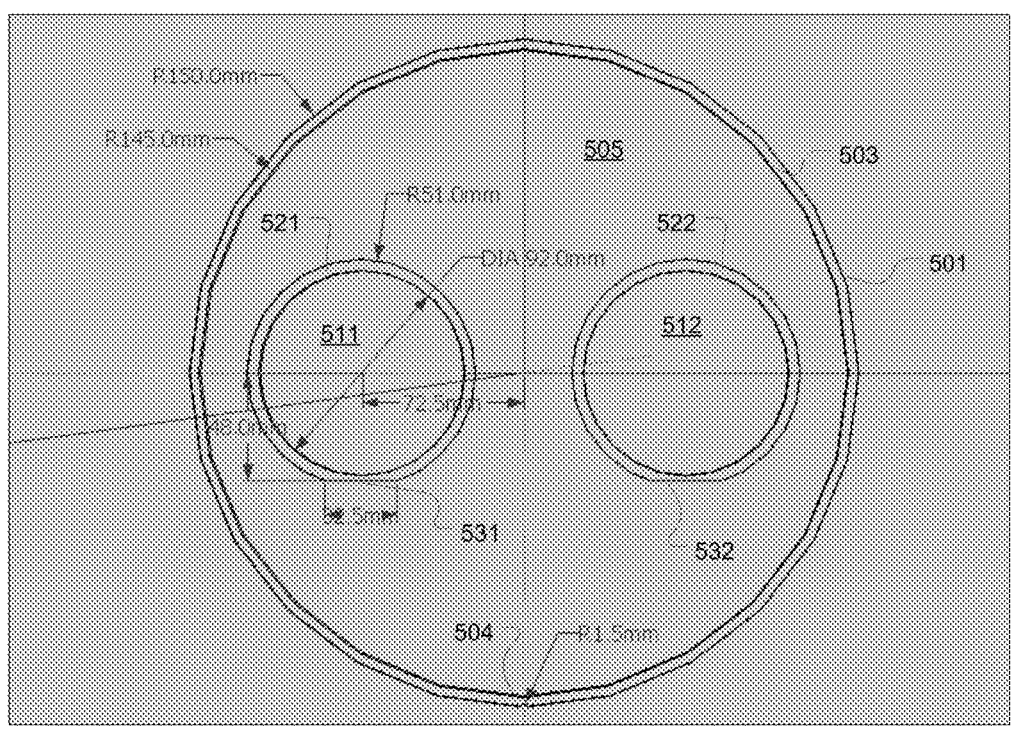
FIG. 5 illustrates the configuration of an exemplary horizontal substrate adaptor that can support two 100 mm wafers horizontally in accordance with an embodiment of the present disclosure.

FIG. 5 illustrates the configuration of an exemplary horizontal substrate adaptor 500 that can support two 100 mm wafers horizontally in accordance with an embodiment of the present disclosure. The horizontal substrate adaptor 500 is based on a 300 mm planar body 505. It is substantially circular although its circumference may have imperfect curvatures in some locations. Two 100 mm substantially circular cutouts 511 and 512 are formed symmetrically on each half of the body 505 and configured to accommodate two 100 mm wafers entirely.

A step 521 or 522 is formed around the perimeter of each cutout 511 or 512 so that a wafer can sit and be supported thereon. In this configuration, as the horizontal substrate adaptor 500 is placed horizontally (e.g., as sitting in a slot of a 300 mm wafer cassette), an entire 100 mm wafer can sits on the step and entirely fits in the cutout (e.g., see the wafers fitting in the horizontal substrate adaptors in FIG. 2). In the illustrated example, the step is about 5 mm wide. The main portion of the circular body (up to radius=145 mm) may be thicker than a 100 mm wafer. However, a 5 mm band 503 around the circle perimeter is machined to have substantially the same thickness as the edge of a 300 mm wafer such that the edge 501 can fit in a slot of a standard 300 mm wafer cassette. Further, the horizontal substrate holder 500 has an alignment notch 504 with radius of 1.5 mm, similar with a standard 300 mm wafer. By the same token, the cutouts 511-512 have alignment flats 531-532 for standard 100 mm wafers to fit in. The weight of adaptor 501 is approximately equal to the weight of a 300 mm wafer minus the weight of the wafers expected to be inserted into slots 511 and 512.

Figure 6A:
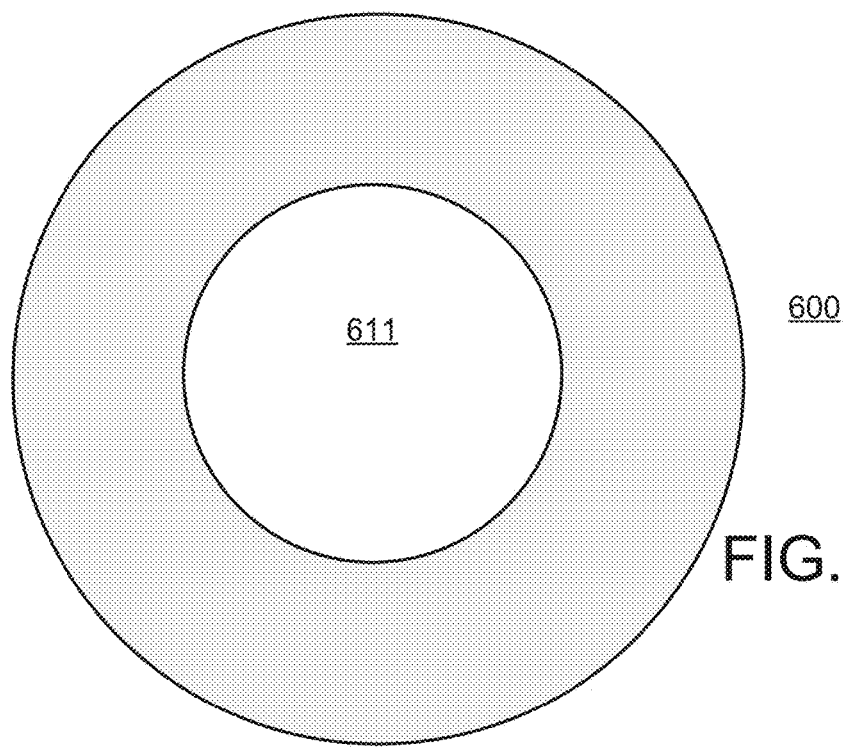
FIGS. 6A-6B illustrate exemplary cutout layouts in horizontal substrate adaptors in accordance with embodiments of the present disclosure.
Figure 6B:
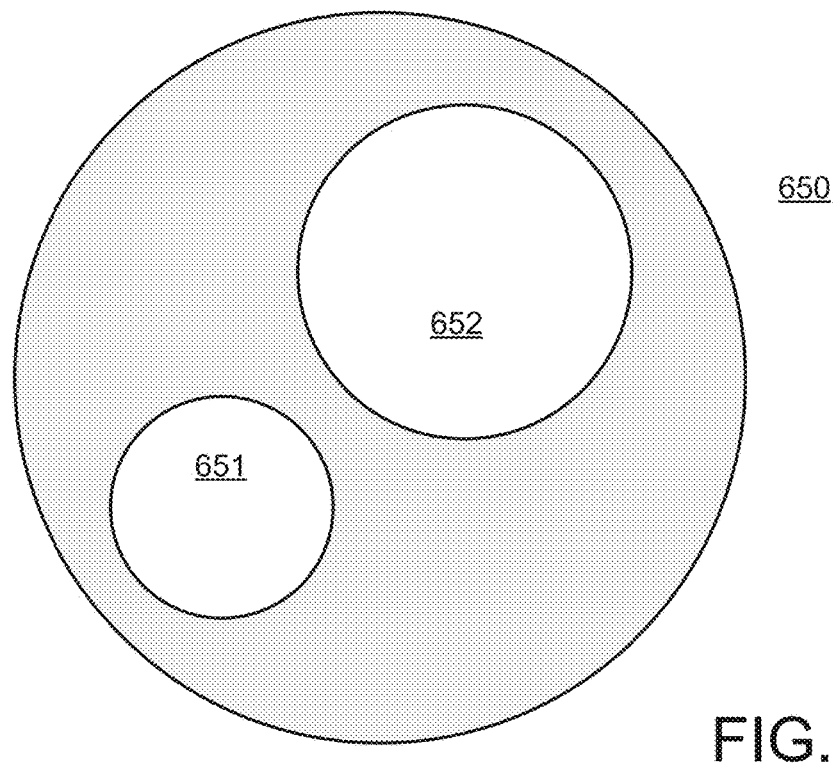

FIGS. 6A-6B illustrate exemplary cutout layouts in horizontal substrate adaptors 600 and 650 in accordance with embodiments of the present disclosure. FIG. 6A shows that the horizontal substrate adaptor 600 has a single cutout 611 configured to accommodate a 150 mm wafer. FIG. 6B shows that the horizontal substrate adaptor 650 has two cutouts 651 and 652 configured to accommodate two wafers of different dimensions e.g., 50 mm and 100 mm wafers respectively. It will be appreciated that the substrate adaptors 600 and 650 have other features such as steps, edge bands, flats and notches similar with those described in FIG. 5 which are not explicitly shown here. The weight of either 600 or 650 is equal to the weight of a 300 mm wafer minus the weight of the wafer(s) that are expected to be inserted therein.

A substrate adaptor according to an embodiment of the present disclosure can be implemented by machining a planar quartz body or any other suitable material in any manner that is well known to a person skilled in the art.

Figure 7:
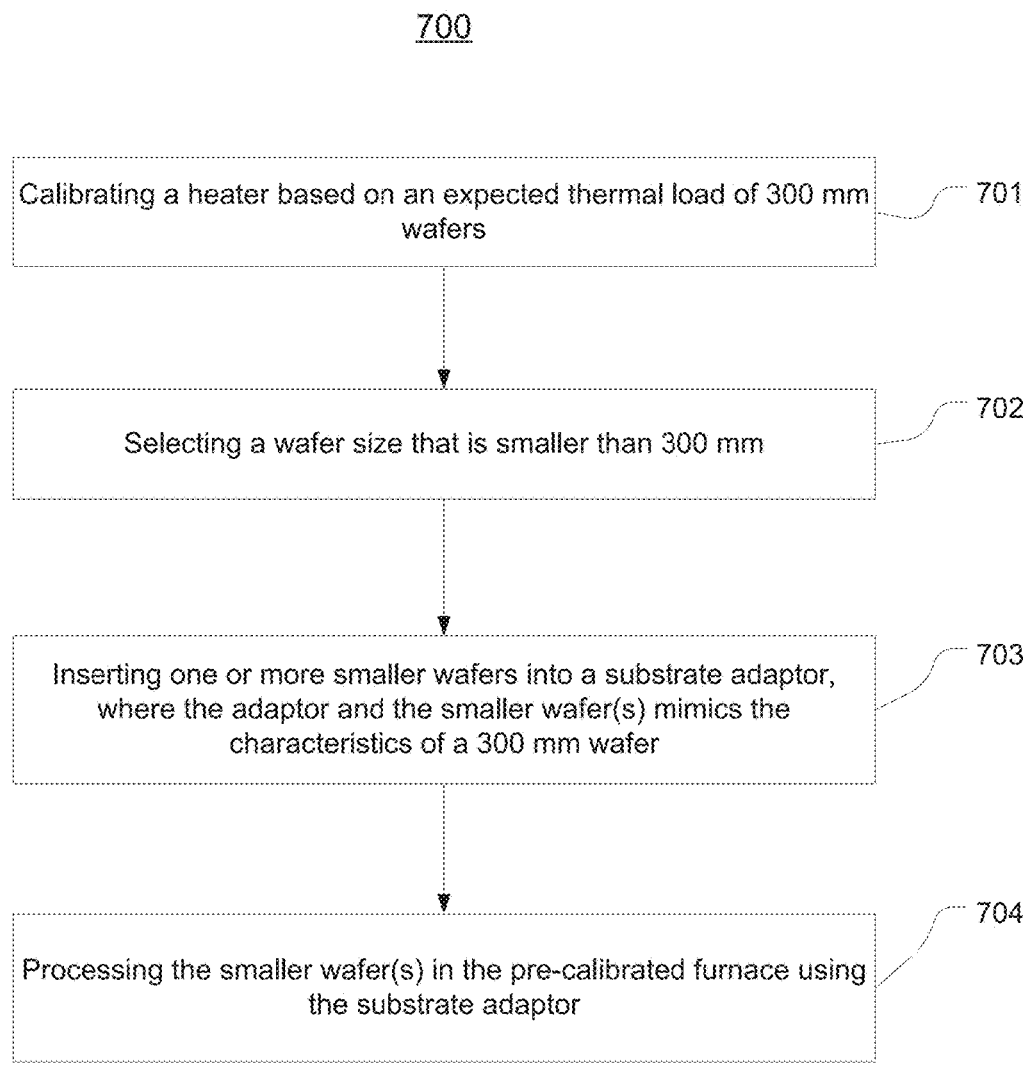
FIG. 7 is a flow chart depicting an exemplary method of processing a smaller wafer in a processing chamber that is optimized for 300 mm wafers by using a substrate adaptor in accordance with an embodiment of the present disclosure.

FIG. 7 is a flow chart depicting an exemplary method 700 of processing a smaller wafer in a processing chamber that is optimized for 300 mm wafers by using a substrate adaptor in accordance with an embodiment of the present disclosure. In this example, the wafer is loaded and processed in a magnetic annealing furnace as shown in FIGS. 1-2. At 701, the heater of the annealing furnace, and more particularly the PID controller of the heater, is calibrated based on an expected thermal load of 300 mm wafers. At 702, a smaller size of wafers is selected, e.g., 50 mm or 150 mm. At 703, one or more smaller wafers are inserted into a substrate adaptor. The adaptor and the smaller wafer(s) mimic the characteristics of the 300 mm wafer. Depending on the process, the substrate adaptor can be a vertical or a horizontal one, as described in greater detail above with reference to FIGS. 3-6B. At 704, the smaller wafer(s) coupled with the substrate adaptor is loaded into the annealing furnace and processed in the pre-calibrated furnace. The wafer(s) and substrate adaptor may be loaded into a cassette before loading into the annealing furnace.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A planar wafer adaptor comprises:
a planar body;
a first cutout from the planar body;
a first boundary having a perimeter contour substantially equivalent to a semiconductor wafer of a first dimension;
a second boundary along said first cutout and having a perimeter contour substantially equivalent to a semiconductor wafer of a second dimension; and
a lateral step disposed along said second boundary and configured to support an edge of said semiconductor wafer of said second dimension and configured to align said semiconductor wafer of said second dimension in a horizontal orientation when said planar body is aligned horizontally, wherein said planar body has a thermal mass that is substantially equal to a thermal mass of a semiconductor wafer of said first dimension minus an expected thermal mass of said semiconductor wafer of said second dimension.

2. The planar wafer adaptor of claim 1, wherein said planar body comprises quartz.

3. The planar wafer adaptor of claim 1, wherein said first boundary comprises a notch.

4. The planar wafer adaptor of claim 1, wherein said first boundary is configured to fit in a cassette configured to accommodate semiconductor wafers of said first dimension.

5. The planar wafer adaptor of claim 1, wherein said first boundary substantially defines a circle.

6. The planar wafer adaptor of claim 1, wherein said first cutout is substantially a circle.

7. The planar wafer adaptor of claim 1, wherein said second boundary comprises a flat cut.

8. The planar wafer adaptor of claim 1, wherein a semiconductor wafer of said first dimension is 300 mm in diameter.

9. The planar wafer adaptor of claim 1, wherein said semiconductor wafer of said second dimension is one of 50 mm, 100 mm, 150 mm and 200 mm in diameter.

10. The planar wafer adaptor of claim 1, wherein said step is 3 mm in width.

11. The planar wafer adaptor of claim 1 further comprises:
a second cutout from the planar body;
a third boundary along said second cutout and having a perimeter contour substantially equivalent to a semiconductor wafer of said second dimension; and
a step disposed along said third boundary and configured to receive an edge of a semiconductor wafer of said second dimension.

12. The planar wafer adaptor of claim 1 further comprises:
a second cutout from the planar body;
a third boundary along said second cutout and having a perimeter contour substantially equivalent to a semiconductor water of a third dimension; and
a step disposed along said third boundary and configured to receive an edge of said semiconductor wafer of said third dimension.

13. A planar wafer holder comprising:
a planar body having a perimeter contour substantially equivalent to a semiconductor wafer of a first dimension;
a first cutout from the planar body and having a perimeter contour substantially equivalent to a semiconductor wafer of a second dimension that is smaller than said first dimension,
a step disposed along said first cutout and configured to: receive an edge of said semiconductor wafer of said second dimension; and hold said semiconductor wafer of said second dimension in a cassette configured to contain semiconductor wafers of said first dimension, wherein a weight of said planar wafer holder in combination with said semiconductor wafer of said second dimension is substantially equal to a weight of a semiconductor wafer of said first dimension.

14. The planar wafer holder of claim 13, wherein said planar body comprises quartz.

15. The planar wafer holder of claim 13, wherein said planar body is substantially a circle of said first dimension and wherein said first cutout is substantially a circle of said second dimension.

16. The planar wafer holder of claim 15, wherein a semiconductor wafer of said first dimension is 300 mm in diameter, and wherein said semiconductor wafer of said second dimension is one of 50 mm, 100 mm, 150 mm and 200 mm in diameter.

17. The planar wafer holder of claim 15, wherein said planar body comprises a notch and wherein further said first cutout comprises a flat cut.

18. The planar wafer holder of claim 15 further comprising:
a second cutout from the planar body;
a third boundary along said second cutout and having a perimeter contour substantia equivalent to a semiconductor wafer of said second dimension; and
a step disposed along said third boundary and configured to receive an edge of a semiconductor wafer of said second dimension.

19. The planar wafer holder of claim 15 further comprises:
a second cutout from the planar body;
a third boundary along said second cutout and having a perimeter contour substantially equivalent to a semiconductor wafer of a third dimension; and a step disposed along said third boundary and configured to receive an edge of said semiconductor wafer of said third dimension.

20. A method of processing semiconductor wafers in a processing apparatus, said method comprising:
  calibrating a heating system of said processing apparatus based on a thermal load of a semiconductor wafer of a first dimension;
  providing a semiconductor wafer of a second dimension that is smaller than said first dimension;
  providing a substrate adaptor configured to horizontally support said semiconductor wafer of said second dimension, wherein said substrate adaptor comprises:
    a planar body having a perimeter contour substantially equivalent to a semiconductor wafer of said first dimension;
    a first cutout from the planar body and having a perimeter contour substantially equivalent to said semiconductor wafer of said second dimension that is smaller than said first dimension; and
    a step disposed along said first cutout and configured to hold said semiconductor wafer of said second dimension in a cassette configured to contain semiconductor wafers of said first dimension,
  placing said semiconductor wafer of said second dimension onto said step to fit in said first cutout;
  loading said semiconductor wafer of said second dimension with said substrate adaptor into a cassette configured to contain a semiconductor wafer of said first dimension;
  loading said cassette containing said semiconductor wafer of said second dimension with said substrate adaptor to said processing apparatus; and
  processing said semiconductor wafer of said second dimension in said processing apparatus in a horizontal orientation.

21. The method of claim 20, wherein said processing comprises annealing said semiconductor wafer of said second dimension with an external magnetic field that is perpendicular to said semiconductor wafer of said second dimension.

22. The method of claim 20, wherein said planar body has a thermal mass that is substantially equal to a thermal mass of a semiconductor wafer of said first dimension minus a thermal mass of said semiconductor wafer of said second dimension.

* * * * *